(12) United States Patent
Mar

(10) Patent No.: US 6,806,746 B1
(45) Date of Patent: Oct. 19, 2004

(54) DIRECT FREQUENCY SYNTHESIZER FOR OFFSET LOOP SYNTHESIZER

(75) Inventor: Wing J. Mar, Rohnert Park, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/633,225

(22) Filed: Jul. 31, 2003

(51) Int. Cl.[7] .............................................. H03B 21/00
(52) U.S. Cl. ...................................... 327/105; 327/356
(58) Field of Search ................................ 327/105, 106, 327/107, 147, 156, 356; 331/14, 16, 37; 375/376

(56) References Cited

U.S. PATENT DOCUMENTS 5,596,290 A * 1/1997 Watkins et al. ............. 327/105
6,295,020 B1 * 9/2001 Koechlin .................... 342/175

* cited by examiner

Primary Examiner—Linh M. Nguyen
(74) Attorney, Agent, or Firm—John L. Imperato

(57) ABSTRACT

A direct frequency synthesizer provides an output signal derived from a high frequency reference signal that is frequency divided and mixed to satisfy the coarse step synthesis requirements of an offset loop synthesizer. The absence of a VCO within the direct frequency synthesizer, provides the direct frequency synthesizer with lower phase noise than a typical PLL-based coarse step synthesizer. Though applicable to a variety of types of synthesizers and signal generators, the direct frequency synthesizer provides especially advantageous noise performance when used to generate an offset signal for an offset loop synthesizer of the first local oscillator of a spectrum analyzer, where the second local oscillator of the spectrum analyzer provides the reference signal for the direct frequency synthesizer.

20 Claims, 5 Drawing Sheets

DIRECT FREQUENCY SYNTHESIZER FOR OFFSET LOOP SYNTHESIZER

BACKGROUND OF THE INVENTION

High-frequency spectrum analyzers typically include a series of frequency conversion stages to facilitate analysis of applied input signals. In FIG. 1, a block diagram of frequency conversion stages within a conventional high-frequency spectrum analyzer are shown. An input signal $S_{IN}$ at frequency $f_{IN}$ that is applied to the spectrum analyzer is converted to a first intermediate frequency signal IF1 by mixing the input signal with a signal $S_{LO1}$ at frequency $f_{LO1}$ provided by a first local oscillator LO1. This first intermediate signal IF1 is further converted to intermediate frequency signals IF2, IF3 having successively lower frequencies $f_{IF2}$, $f_{IF3}$, respectively. Bandpass filters BPF1–BPF3 eliminate image signals resulting from the mixing to provide an unambiguous representation of the applied input signal $S_{IN}$ at the third intermediate frequency $f_{IF3}$.

The third intermediate frequency signal has a frequency $f_{IF3}=f_{IF2}-f_{LO3}=f_{IF1}-f_{LO2}-f_{LO3}=f_{LO1}-f_{IN}-f_{LO2}-f_{LO3}$, indicating that a detected response at the frequency $f_{IF3}$ is attributable to the input signal $S_{IN}$ having a frequency $f_{IN}=f_{LO1}-f_{LO2}-f_{LO3}-f_{IF3}$. Because the frequency $f_{IF3}$ of the third intermediate frequency signal IF3 and the frequencies $f_{LO1}$, $f_{LO2}$, $f_{LO3}$ of the local oscillators are known, the frequency $f_{IN}$ of the input signal $S_{IN}$ is readily established. The frequencies $f_{LO2}$, $f_{LO3}$, and $f_{IF3}$ are generally fixed, whereas the frequency $f_{LO1}$ of the first local oscillator LO1 is generally tuned to accommodate input signals $S_{IN}$ over a wide range of frequencies $f_{IN}$.

The measurement accuracy of a spectrum analyzer depends on the quality of the signals $S_{LO1}$–$S_{LO3}$ provided by the local oscillators LO1–LO3 in the frequency conversion stages. Ideally, the local oscillators provide stable, low-noise signals and don't contribute significant noise to the intermediate frequency signals provided by the frequency conversion stages. However, practical implementations of the local oscillators provide signals that have short-term frequency instabilities and fluctuations, commonly referred to as phase noise. Since the phase noise of a local oscillator generally increases with operating frequency, the first local oscillator LO1, being the highest frequency local oscillator in the spectrum analyzer, is typically a higher phase noise contributor than the other local oscillators in the spectrum analyzer. In addition, the frequency tuning feature of the first local oscillator LO1 tends to further increase the phase noise the local oscillator. Because the phase noise of the local oscillators can degrade the measurement accuracy of the spectrum analyzer, there is motivation to improve the noise performance of the local oscillators in the frequency conversion stages of the spectrum analyzer, particularly by lowering the phase noise of the first local oscillator LO1.

A known way of lowering phase noise involves using an offset-loop synthesizer 2 to generate the first local oscillator signal $S_{LO1}$, as shown in FIG. 2. The offset-loop synthesizer includes a course-step synthesizer phase locked loop (PLL) 4 that provides an offset signal S0 to a main (PLL) 6 of the offset loop synthesizer that provides the signal $S_{LO1}$. The offset signal S0 eliminates the need for frequency division in the feedback path of the main PLL, thereby reducing the phase noise of the signal $S_{LO1}$. However, because the frequency $f_0$ of the offset signal S0 is multiplied by a harmonic mixer 40 in the main PLL, the phase noise of the offset signal S0 is also multiplied. Accordingly, it is advantageous for the offset signal S0 provided by the coarse step synthesizer PLL to have especially low phase noise.

Low phase noise is typically achieved in the coarse step synthesizer PLL by eliminating frequency division in the feedback path in the M/N loop used to implement the coarse step synthesizer PLL. This is done by setting the value of M to unity and by varying N, the divide ratio of the programmable divider D, to set the frequency $f_0$ of the offset signal S0. The harmonic mixer in the main PLL uses the H-th harmonic of the signal S0 to produce a signal with a frequency close to the resulting frequency $f_{LO1}$ of the signal $S_{LO1}$, whereas an interpolation signal $S_{INT}$ provides fine frequency resolution for the signal $S_{LO1}$. This results in the signal $S_{LO1}$ having a frequency $f_{LO1}=H*f_0 \pm f_{INT}$, where $f_{INT}$ is the frequency of the interpolation signal $S_{INT}$. This frequency relationship illustrates that the phase noise of the signal $S_{LO1}$ is the harmonic number H times the phase noise of the coarse step synthesizer PLL, plus the phase noise of the interpolation signal. Thus, while the noise gain of the main PLL with respect to the interpolation signal $S_{INT}$ is unity, the noise gain with respect to the coarse step synthesizer PLL is H, the harmonic multiplier of the harmonic mixer in the main PLL of the offset loop synthesizer. This noise gain results in multiplication of the inherent phase noise of the VCO and other components of the coarse step synthesizer PLL, which can degrade the measurement accuracy of the spectrum analyzer within which this type of offset loop synthesizer is included.

SUMMARY OF THE INVENTION

Embodiments of the present invention are directed toward a direct frequency synthesizer suitable for replacing the coarse step synthesizer PLL in an offset loop synthesizer. The output signal from the direct frequency synthesizer is derived from a high frequency reference signal that is frequency divided and mixed to satisfy the coarse step synthesis requirements of an offset loop synthesizer. The absence of a VCO within the direct frequency synthesizer provides the direct frequency synthesizer with lower phase noise than a typical PLL-based coarse step synthesizer. Though applicable to a variety of types of synthesizers and signal generators, the direct frequency synthesizer can provide especially low phase noise when used to generate an offset signal for an offset loop synthesizer of the first local oscillator of a spectrum analyzer, where the second local oscillator of the spectrum analyzer provides the reference signal for the direct frequency synthesizer. Alternative embodiments of the present invention are directed toward a direct frequency synthesis method.

DETAILED DESCRIPTION OF THE EMBODIMENTS

Figure 3:
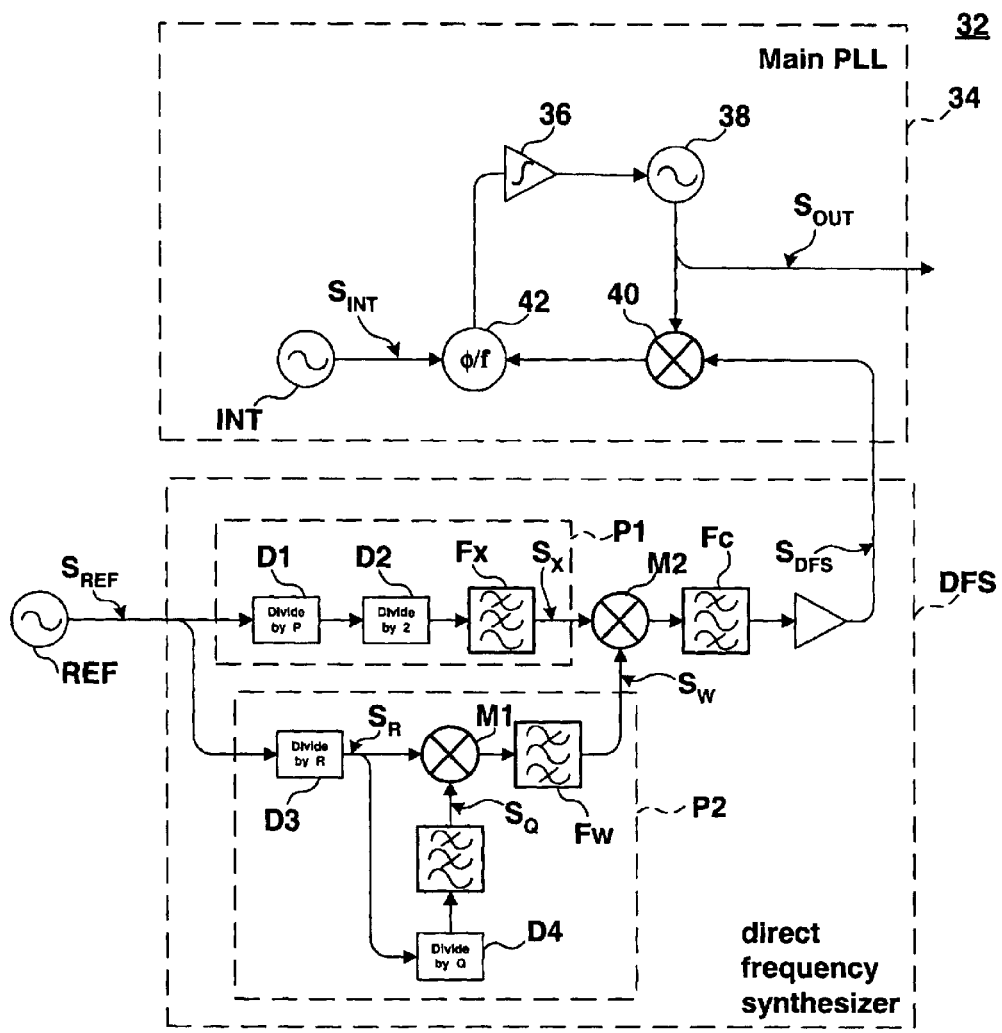
FIG. 3 is a block diagram of a direct frequency synthesizer according to embodiments of the present invention, suitable for generating an offset signal for an offset loop synthesizer.

A direct frequency synthesizer DFS according to embodiments of the present invention (shown in FIG. 3) provides an output signal $S_{DFS}$ that is suitable for use with an offset loop synthesizer 32. Typically, the offset loop synthesizer 32 includes a main PLL 34 with a loop integrator 36 and VCO (voltage-controlled oscillator) 38. A harmonic mixer 40 and an interpolation source INT in the main PLL 34 are coupled to a frequency/phase detector 42. The harmonic mixer 40, typically a microwave sampler or a harmonic generator combined with a mixer, uses a harmonic H of the output signal $S_{DFS}$ having a frequency that is close to the resulting frequency $f_{OUT}$ of a signal $S_{OUT}$ provided by the main PLL 34 of the offset loop synthesizer 32. The harmonic multiple H of the signal $S_{DFS}$ varies according to the frequency $f_{OUT}$ of the signal $S_{OUT}$ provided by the offset loop synthesizer 32. The interpolation source INT provides fine frequency resolution for the offset loop synthesizer 32 by interpolating between gaps in the frequencies of the output signal $S_{DFS}$ that get multiplied by the harmonic mixer 40 of the direct frequency synthesizer DFS.

In the direct frequency synthesizer DFS, the output signal $S_{DFS}$ is provided by frequency dividing an applied reference signal $S_{REF}$ in alternative frequency division paths P1, P2. In a first frequency division path P1, a frequency divider D1 divides the frequency $f_{REF}$ of the reference signal $S_{REF}$ by the divisor P. A frequency divider D2 cascaded with the frequency divider D1 further divides the resulting signal by two. These frequency divisions result in a signal $S_X$ at frequency fx=$f_{REF}$/(2P) that gets filtered by a filter Fx. Typical implementations for the frequency divider D1 having variable divide ratio P result in the frequency divider D1 producing a series of narrow output pulses having strong harmonic content in response to the reference signal $S_{REF}$. The cascaded frequency divider D2 provides a square wave output from the series of narrow output pulses. The square wave output has a strong fundamental signal component that improves signal-to-noise ratio of the direct frequency synthesizer DFS, and has low level even harmonic signal components that ease constraints on the filter Fx that filters the signal $S_X$ and reduces spurious mixing products within the direct frequency synthesizer DFS. A low noise pulse stretcher, though more complex than the frequency divider D2, is alternatively used in place of the frequency divider D2. The frequency divider D2 is optionally omitted, depending on the required signal quality of the output signal $S_{DFS}$ provided the direct frequency synthesizer DFS.

In a second frequency division path P2, a frequency divider D3 divides the applied reference signal $S_{REF}$ by the divisor R to provide a signal $S_R$ having frequency $f_R$. A frequency divider D4 further divides the signal $S_R$ by the divisor Q to provide a signal $S_Q$ having frequency $f_Q$. Typically, the frequency divider D3 has a fixed divide ratio while the frequency divider D4 has two or more alternative divide ratio settings. The signals $S_R$ and $S_Q$ in the second frequency division path P2 are applied to the inputs of a mixer M1. A filter Fw selects a predesignated mixing product at the output port of the mixer M1, resulting in a signal $S_W$ having a frequency $f_W=f_R\pm f_Q=(f_{REF}/R)(1\pm 1/Q)$.

The signal $S_W$ provided by the frequency division path P2 and the signal $S_X$ provided by the frequency division path P1 are applied to inputs of a mixer M2. A filter Fc selects a designated mixing product at the output of the mixer M2 to provide the signal $S_{DFS}$, while rejecting feed through of the signal $S_W$, an image signal $S'_{DFS}$, and other unwanted mixing products and spurs at the output of the mixer M2.

Figure 4:
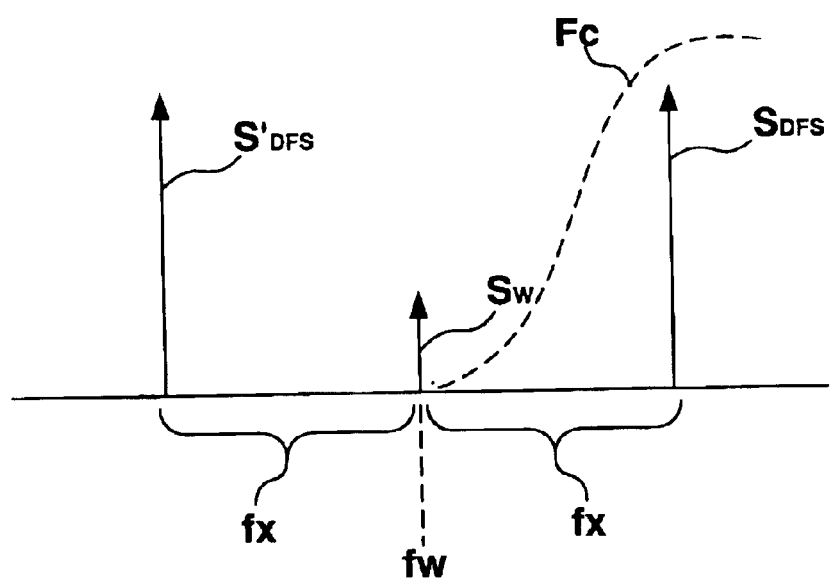
FIG. 4 shows exemplary signals in the direct frequency synthesizer.

FIG. 4 shows exemplary signals at the output of the mixer M2. The signal $S_{DFS}$ (at frequency $f_{DFS}$) at the output of the mixer M2 is offset from the signal $S_W$ (at frequency $f_W$) by the frequency $f_X$ of the signal $S_X$. Since the frequency offset $f_X$ is determined by the divisor P of the frequency divider D1, the divisor P is designated to be sufficiently small to separate the signal $S_{DFS}$ from the signal $S_W$ and facilitate implementation of the filter Fc. As the divisor P decreases, the signal $S_{DFS}$ is offset from the signal Sw by a correspondingly greater frequency offset fx, thereby reducing the selectivity required by the filter Fc. The filter Fc is typically implemented as a tuneable bandpass, bandstop, highpass, lowpass, or elliptical filter, or any other type of filter suitable for selecting the signal $S_{DFS}$.

The frequency resolution of the signal $S_{DFS}$ is established primarily by the frequency resolution of the signal $S_X$, which correspondingly increases as the divisor P increases. Thus, while the divisor P is sufficiently small to enable the filter Fc to adequately select the designated mixing product $S_{DFS}$ at the output of the mixer M2, the divisor P is large enough to provide sufficiently high frequency resolution to meet the performance requirements of a designated application of the direct frequency synthesizer DFS.

The signal $S_{DFS}$ has a comprehensive set of output frequencies $f_{DFS}$ provided by the combination of the frequency divider D3 having fixed divide ratio R, the frequency divider D4 having alternative divide ratio settings Q, the frequency divider P having programmable divide ratio P, and the mixing provided by the mixers M1, M2. Particularly, the signal $S_{DFS}$ has frequencies $f_{DFS}=f_W\pm f_X=f_{REF}((1/R)\pm(1/(RQ))\pm(1/(2P)))$. As an example, with the reference signal $S_{REF}$ set to 3.6 GHz, the divisor R equal to six, and the divisor Q alternatively equal to ten or twelve, two pairs of upper and lower mixing products at frequencies fw equal to 550 MHz and 650 MHz, or 540 MHz and 660 MHz, are alternatively generated at the output of the mixer M1. A designated one of the upper or lower mixing products is selected by the filter Fw. The divisor P of the first frequency divider D1 is programed to provide fine frequency steps or increments in the signal $S_X$. When the signal $S_{DFS}$ is applied to the main PLL 34 gaps in the frequencies $f_{DFS}$ of the signal $S_{DFS}$ are filled by the frequency coverage of the interpolation signal $S_{INT}$, which in this example spans between 30 and 70 MHz.

The reference source REF that provides the signal $S_{REF}$ to the frequency division paths P1, P2 is typically a cavity tuned oscillator, dielectric resonator oscillator or other low phase noise signal source. The frequency $f_{REF}$ of the reference signal $S_{REF}$ is sufficiently high so that the division and mixing in the direct frequency synthesizer DFS provides sufficient numbers of frequencies $f_{DFS}$ for the signal $S_{DFS}$. When the direct frequency synthesizer DFS is used in a spectrum analyzer, the second local oscillator LO2 (shown in FIG. 1) is typically available and has sufficiently high frequency and low enough phase noise to provide the reference signal $S_{REF}$. The frequency division of the reference signal $S_{REF}$ in the frequency division paths P1, P2 correspondingly lowers the phase noise of the signal $S_{DFS}$.

While the direct frequency synthesizer DFS is a suitable for a variety of applications, performance advantages result when the direct frequency synthesizer DFS is included in a spectrum analyzer. Particularly, low phase noise results in the spectrum analyzer when the reference signal $S_{REF}$ is provided by the second local oscillator LO2 in the spectrum analyzer, and when the signal $S_{DFS}$ is applied to the main PLL 34 of an offset loop synthesizer 32 that provides the first local oscillator LO1 of the spectrum analyzer. Under these conditions, a portion of the phase noise of the reference signal $S_{REF}$ provided by the second local oscillator LO2 and imparted to the intermediate frequency signals in the spectrum analyzer is suppressed by the frequency conversion performed in the spectrum analyzer.

Figure 1:
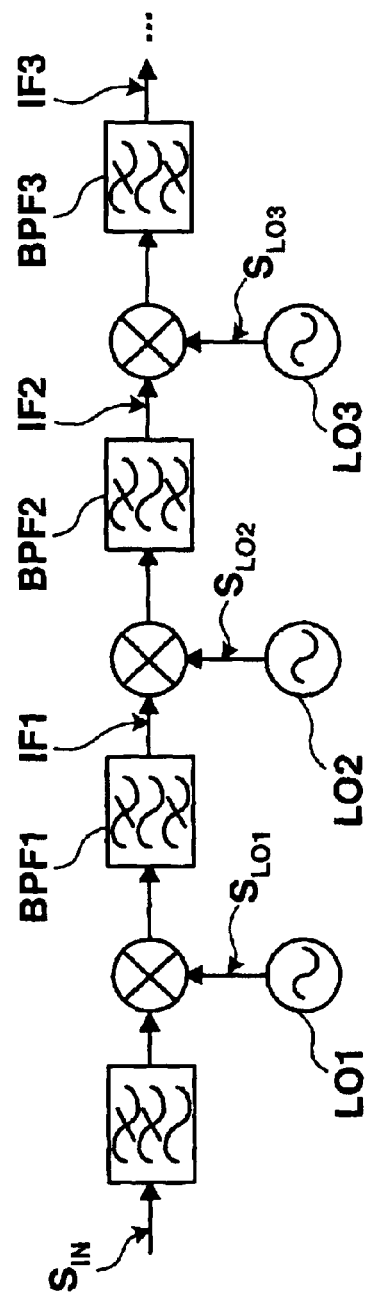
FIG. 1 shows a typical arrangement of frequency conversion stages for a conventional high frequency spectrum analyzer.

This phase noise suppression is illustrated via the frequency relationships of the signals of the direct frequency synthesizer DFS, the main PLL 34 of the offset loop synthesizer 32, and the frequency conversion stages of the spectrum analyzer (shown in the block diagram of FIG. 1). With the signal $S_{OUT}$ providing the first local oscillator signal $S_{LO1}$ of the spectrum analyzer and with the reference signal $S_{REF}$ being provided by the second local oscillator LO2, the first local oscillator LO1 has a frequency $$f_{LO1} = H * f_{DFS} \pm f_{INT} = H * f_{LO2} * ((1/R) \pm (1/RQ) \pm 1/2P)) \pm f_{INT}$$
$$= k * f_{LO2} \pm f_{INT}$$

where $k=H*((1/R)\pm(1/RQ)\pm1/2P))$. The value of k is determined from the above frequency relationships, and the relationships between frequencies in the frequency conversion stages of the spectrum analyzer as follows:

$f_{IN}=f_{LO1}-f_{LO2}-f_{LO3}-f_{IF3}$;
$f_{LO1}-f_{LO2}=f_{IN}+f_{LO3}+f_{IF3}$;
$k*f_{LO2}\pm f_{INT}-f_{LO2}=f_{IN}+f_{LO3}+f_{IF3}$;
$f_{LO2}(k-1)=f_{IN}+f_{LO3}+f_{IF3}\pm f_{INT}$;
yielding $k=((f_{IN}+f_{LO3}+f_{IF3}\pm f_{INT})/f_{LO2})+1$.

In a typical example, $f_{REF}=f_{LO2}=3600$ MHz, $f_{LO3}=300$ MHz, $f_{IF3}=21.4$ MHz and $f_{INT}$ is less than 70 MHz. This results in the value of k being equal to about 1.1 for input signals $S_{IN}$ at frequencies $f_{IN}$ substantially less than the frequency $f_{LO2}$, and k being equal to about 1.9 for frequencies $f_{IN}$ being on the order of $f_{LO2}$, for example 3 GHz. Since the third intermediate frequency signal IF3 in the spectrum analyzer has a frequency $f_{IF3}=f_{LO2}[k-1]-f_{LO3}-f_{IN}\pm f_{INT}$, a significant reduction in the phase noise imparted to the third intermediate frequency signal IF3 results by the resulting multiplication of the frequency, and hence the phase noise of the first and second local oscillators, by the factor k−1, which is typically less than unity.

Figure 2:
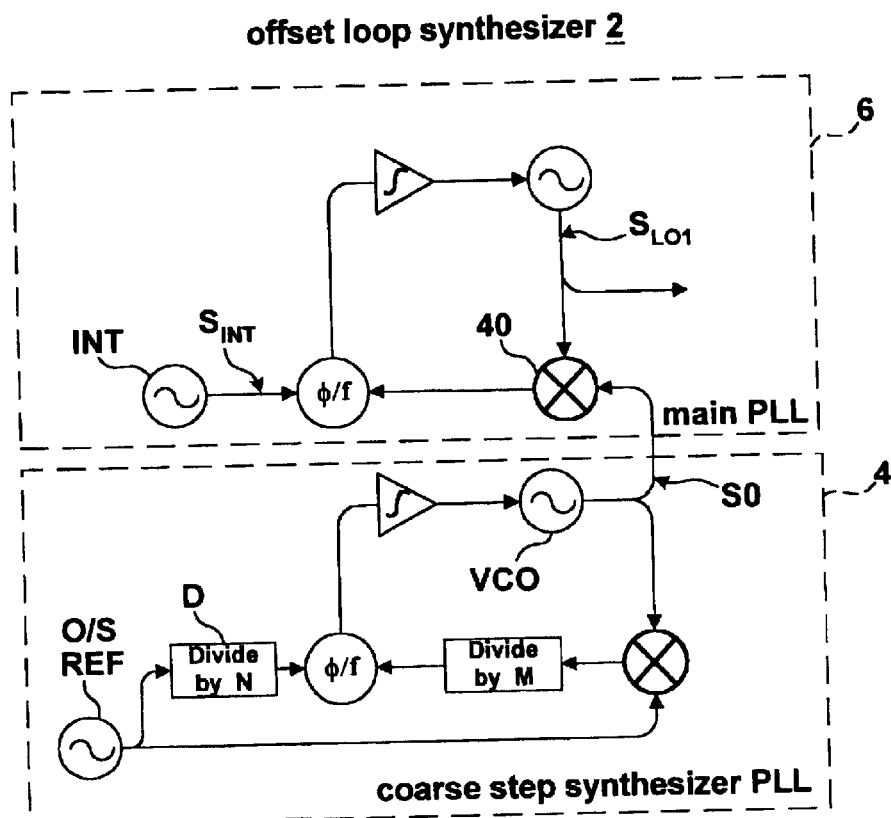
FIG. 2 is a block diagram of an offset loop synthesizer including a prior art coarse step synthesizer PLL, suitable for a local oscillator of the frequency conversion stages shown in FIG. 1.

An example illustrates the resulting phase noise difference in a spectrum analyzer at a 10 kHz offset between the signal $S_{OUT}$ being provided to the main PLL in the offset loop synthesizer 32 using the direct frequency synthesizer DFS, and the offset signal S0 being provided by the prior art PLL-based coarse step synthesizer 4 shown in FIG. 2. For this example, at the 10 kHz offset:

the phase noise of the signal S0 is approximately −140 dBc/Hz at frequency $f_0$=600 MHz;

the phase noise of the reference signal $S_{REF}$ is approximately −125 dBc/Hz at frequency $f_{REF}$=3600 MHz;

the phase noise of the third local oscillator LO3 is approximately −145 dBc/Hz at frequency $f_{LO3}$=300 MHz; and the phase noise of the interpolation signal $S_{INT}$ is approximately −135 dBc/Hz at frequencies $f_{INT}$=50 MHz.

For input signals $S_{IN}$ that have frequencies $f_{IN}<<f_{LO2}$, using the prior art PLL-based coarse step synthesizer 4, the sixth harmonic H of the offset signal S0 is used to generate the first local oscillator signal $S_{LO1}$. This results in the 10 kHz phase noise due to the offset signal S0 being −140 dBc/Hz+20 log(6) or −124.4 dBc/Hz. Thus, the dominant phase noise contributors are the first and second local oscillators LO1, LO2. Because the phase noises are uncorrelated, the combined phase noise results in the spectrum analyzer having a phase noise of approximately −121.5 dBc/Hz. In contrast, with the direct frequency synthesizer DFS, the phase noise of the first local oscillator LO1 and the second local oscillator LO2 are correlated, resulting in the combined phase noise of the local oscillators being approximately −125 dBc/Hz+20 log(k−1) which is approximately −145 dBc/Hz when k equals approximately 1.1. Because of this noise the phase noise of the spectrum analyzer is determined not by first local oscillator LO1 and the second local oscillator LO2, but by the lower phase noise of the interpolation signal $S_{INT}$, which results in the phase noise of the spectrum analyzer being approximately −135 dBc/Hz.

For input signals $S_{IN}$ that have frequencies $f_{IN}$ on the order of the frequency $f_{LO2}$, using the prior art PLL-based coarse step synthesizer 4, the tenth harmonic H of the offset signal S0 is used to generate the first local oscillator signal $S_{LO1}$, which results in the 10 kHz phase noise due to the offset signal S0 being −140 dBc/Hz+20 log(10) or −120 dBc/Hz. Thus, the dominant phase noise contributor in the spectrum analyzer is the offset signal S0 with some phase noise contribution from the second local oscillator LO2. This combined phase noise results in the spectrum analyzer having a phase noise of −118.7 dBc/Hz at 10 kHz offset. In contrast, using the direct frequency synthesizer DFS, the phase noise of the first local oscillator LO1 and the second local oscillator LO2 is −125 dBc/Hz+20 log(k−1) or approximately −125.9 dBc/Hz when k is approximately 1.9. Here, the phase noise in the spectrum analyzer is determined by the combined phase noise of the first and second local oscillators LO1, LO2, which results in the spectrum analyzer having a phase noise of approximately −125.4 dBc/Hz.

In sum, using the prior art PLL-based coarse step synthesizer 4 to generate the first local oscillator signal in a spectrum analyzer results in the phase noise of the spectrum analyzer varying from approximately −121.5 to −118.7 dBc/Hz over an exemplary range of frequencies $f_{IN}$ for the input signals $S_{IN}$. Using the direct frequency synthesizer DFS to generate the first local oscillator signal in the spectrum analyzer over the same frequency range of input signals $S_{IN}$ results in the phase noise of the spectrum analyzer varying from approximately −135 to −125 dBc/Hz. Thus, the direct frequency synthesizer DFS enables the spectrum analyzer to have lower phase noise than would be achievable using the prior art PLL-based coarse step synthesizer 4.

Figure 5:
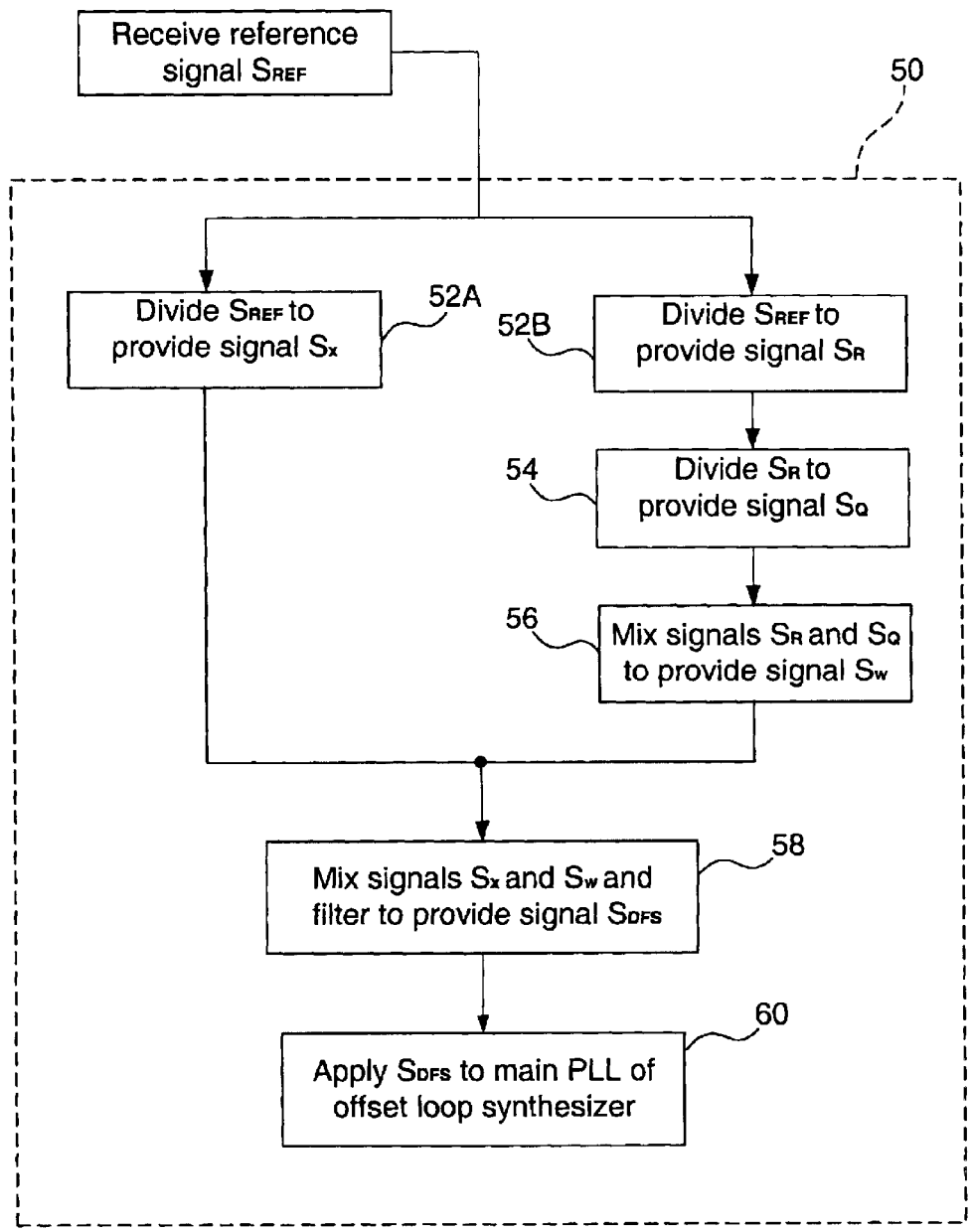
FIG. 5 is a flow diagram of a direct frequency synthesis method according to alternative embodiments of the present invention.

Alternative embodiments of the present invention are directed toward a direct frequency synthesis method 50, shown in FIG. 5. Once the reference signal $S_{REF}$ is received, in step 52A of the method 50, the reference signal $S_{REF}$ is divided in the first frequency division path P1 to provide the signal $S_X$. The reference signal $S_{REF}$ is divided by the divisor R in the second frequency division path P2 to provide the signal $S_R$ (step 52B). The signal $S_R$ is further divided by the divisor Q (step 54) to provide the signal $S_Q$. In step 56, the signal $S_R$ is mixed with the signal $S_Q$ to provide the signal $S_W$. In step 58, the signal $S_W$ is mixed with the signal $S_X$ and the mixing products are filtered to provide the signal $S_{DFS}$. In optional step 60, the output signal $S_{DFS}$ is applied to the main PLL 34 of an offset loop synthesizer 32. Typically, the offset loop synthesizer 32 provides the first local oscillator signal $S_{LO1}$ for the spectrum analyzer and the received reference signal $S_{REF}$ is provided by the second local oscillator LO2 of the spectrum analyzer.

While the embodiments of the present invention have been illustrated in detail, it should be apparent that modifications and adaptations to these embodiments may occur to one skilled in the art without departing from the scope of the present invention as set forth in the following claims.

What is claimed is:

1. A direct frequency synthesizer, comprising:

a first frequency division path dividing an applied reference signal by a first divisor to provide a first signal;

a second frequency division path dividing the reference signal by a second divisor to provide a second signal and dividing the second signal by a third divisor to provide a third signal, the second frequency division path having a mixer receiving the second signal and the third signal; and an output mixer receiving the first signal and a product of the second signal and the third signal, and providing an output signal having a frequency relationship to the applied reference signal.

2. The direct frequency synthesizer of claim 1 wherein the output signal has a frequency of a designated mixing product of the second signal and the third signal, offset in frequency by the frequency of the first signal.

3. The direct frequency synthesizer of claim 1 further comprising an offset loop synthesizer receiving the output signal.

4. The direct frequency synthesizer of claim 2 further comprising an offset loop synthesizer receiving the output signal.

5. The direct frequency synthesizer of claim 3 wherein the offset loop synthesizer provides a first local oscillator signal for a spectrum analyzer.

6. The direct frequency synthesizer of claim 5 wherein the first local oscillator signal has a frequency equal to a harmonic multiple of the frequency of the output signal, offset in frequency by an interpolation signal in the offset loop synthesizer.

7. The direct frequency synthesizer of claim 5 wherein the reference signal is provided by a second local oscillator of the spectrum analyzer.

8. The direct frequency synthesizer of claim 1 wherein the first frequency division path includes a programmable frequency divider and fixed frequency divider cascaded with the programmable frequency divider providing the first signal.

9. The direct frequency synthesizer of claim 1 wherein the second frequency division path includes a first frequency divider having a fixed divisor and providing the second signal, and a second frequency divider having alternative divisor settings and providing the third signal.

10. The direct frequency synthesizer of claim 8 wherein the second frequency division path includes a first frequency divider having a fixed divisor and providing the second signal, and a second frequency divider having alternative divisor settings and providing the third signal.

11. The direct frequency synthesizer of claim 1 further comprising a filter selecting the output signal from a series of mixing products provided by the output mixer.

12. The direct frequency synthesizer of claim 5 wherein the offset loop synthesizer includes a harmonic mixer receiving the output signal and the first local oscillator signal and providing a mixing product to a frequency/phase detector that compares the mixing product with an interpolation signal to control a tuneable oscillator that provides the first local oscillator signal.

13. A direct frequency synthesizer, comprising:

a first frequency division path dividing an applied reference signal by a first divisor to provide a first signal;

a second frequency division path dividing the reference signal by a second divisor to provide a second signal and further dividing the second divided signal by a third divisor to provide a third signal, the second frequency division path having a mixer receiving the second signal and the third signal;

an output mixer receiving the first signal and a product of the second signal and the third signal, providing a first output signal having a frequency relationship to the applied reference signal; and an offset loop synthesizer receiving the first output signal and providing a second output signal related in frequency to the first output signal and an interpolation signal within the offset loop synthesizer.

14. The direct frequency synthesizer of claim 13 wherein the reference signal is provided by a second local oscillator of a spectrum analyzer and the second output signal provides a first local oscillator signal in the spectrum analyzer.

15. The direct frequency synthesizer of claim 13 wherein the second output signal is a harmonic multiple of the first output signal offset by the interpolation signal.

16. The direct frequency synthesizer of claim 15 wherein the first output signal has a frequency of a designated mixing product of the second signal and the third signal, offset in frequency by the frequency of the first signal.

17. A direct frequency synthesis method, comprising:

dividing an applied reference signal by a first divisor to provide a first signal;

dividing the reference signal by a second divisor to provide a second signal;

dividing the second signal by a third divisor to provide a third signal;

mixing the second signal and the third signal; and mixing a designated product of the second signal and the third signal with the first signal to provide an output signal related in frequency to the applied reference signal.

18. The direct frequency synthesis method of claim 17 further comprising applying the output signal to an offset loop synthesizer.

19. The direct frequency synthesis method of claim 18 wherein the offset loop synthesizer provides a first local oscillator signal for a spectrum analyzer.

20. The direct frequency synthesis method of claim 19 wherein the reference signal is provided by a second local oscillator signal of the spectrum analyzer.

* * * * *